Nov. 30, 1965 ZEN'ITI KIYASU ETAL 3,221,181

VARIABLE CAPACITANCE CONTROLLED ESAKI DIODE LOGIC CIRCUIT

Filed Oct. 13, 1960 3 Sheets-Sheet 1

INVENTOR
Zen'iti Kiyasu
Kazuo Husimi

BY
Watson, Cole, Grindle & Watson
ATTORNEYS

Nov. 30, 1965 ZEN'ITI KIYASU ETAL 3,221,181

VARIABLE CAPACITANCE CONTROLLED ESAKI DIODE LOGIC CIRCUIT

Filed Oct. 13, 1960 3 Sheets-Sheet 2

INVENTOR

Zen'iti Kiyasu
Kazuo Husimi

BY

Watson, Cole, Grindle & Watson
ATTORNEYS

INVENTOR
Zen'iti Kiyasu
Kazuo Husimi

BY
Watson, Cole, Grindle & Watson
ATTORNEYS

United States Patent Office 3,221,181

Patented Nov. 30, 1965

3,221,181

VARIABLE CAPACITANCE CONTROLLED ESAKI DIODE LOGIC CIRCUIT

Zen'iti Kiyasu and Kazuo Husimi, Tokyo, Japan, assignors to Nippon Telegraph and Telephone Public Corporation, Tokyo, Japan, a public corporation of Japan

Filed Oct. 13, 1960, Ser. No. 62,491

Claims priority, application Japan, Oct. 29, 1959, 34/33,869; Oct. 30, 1959, 34/33,953; Nov. 2, 1959, 34/34,288; Dec. 8, 1959, 34/37,969

10 Claims. (Cl. 307—88.5)

This invention relates to a logic circuit to be used in information processing apparatus such as electronic computers.

An Esaki diode (tunnel diode) has a dynatron type negative resistance and its switching time is so short that a high speed logic circuit can be made therefore.

A high speed logic circuit in which two Esaki diodes are used in series connection has already been suggested. In this circuit, two equal voltage sources, whose voltage will vary from O to a certain voltage E at the time of excitation and from E to O at the time of non-excitation, are connected in series and the midpoint is earthed. The other ends of the voltage sources are respectively connected to two series connected Esaki diodes in such polarity that the electric potential of the middle point of either Esaki diodes may take two positive or negative stable points. The points at which the midpoint potential of the diodes will settle may be determined by a slight positive or negative control voltage added to said middle point in advance to the change of the voltage of the electric sources from O to E. Therefore, a logical operation can be made therein by transferring the information in turn with three-phase pulses in the same manner as three-phase excitation in a parametron. In such case, for branching, the middle point of the front phase is connected with the middle point of the next phase through a resistance.

However, in the logic circuit utilizing the Esaki diodes, the potential the middle point will take is influenced by the unbalance of the diodes that are used. This is different from a circuit in which the phases are perfectly symmetrical with the O-phase and $\pi$-phase as in the case of a parametron, and it is necessary to raise the input voltage of the Esaki diodes in order to prevent any misoperation due to unbalance. Therefore, there are drawbacks that a high value of the coupling resistance can not be used and even when used, since the following stage presents a lower impedance, the load will increase and the operating speed will reduce when many fan-outs are to be taken.

An object of the present invention is to provide a high speed logical operation circuit wherein elements whose capacitance will vary with the voltage are added in parallel with Esaki diodes so that the input impedance may be elevated and many fan-outs may be taken.

Another object of the present invention is to vary the parallel capacitance added to the Esaki diode by differentially controlling the externally added voltage.

A further object of the present invention is to provide a "NOT" circuit wherein a parallel capacitance is connected to a logic circuit in which a pair of Esaki diodes of substantially equal characteristics are connected in series so that the value of said capacitance may vary with the input potential.

Another further object of the present invention is to provide a logic circuit wherein a barrier capacitance of a semiconductor diode whose capacity will decrease with the voltage is provided in parallel with Esaki diodes in the logic circuit in which a pair of Esaki diodes of substantially equal characteristics are connected in series so that, by controlling the value of the barrier capacitance with the input voltage, an "OR" operation and a "NOT" operation may be carried out.

Of the accompanying drawings.

Figure 1:
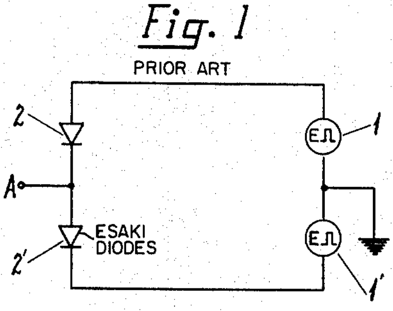
FIGURE 1 is a diagram showing an example of a conventional logic circuit.

A known conventional logic circuit wherein a pair of Esaki diodes are connected in series shall be explained with reference to FIGURE 1. In this circuit, the middle point of two equal variable voltage electric sources 1 and 1' is earthed. The source voltage will vary from O to a certain voltage E at the time of excitation and from E to O at the time of non-excitation. The sources are series connected in the same polarity direction and the other ends of the voltage sources are respectively connected with two Esaki diodes 2 and 2' connected in series. Thus the electric potential of the middle point A of the Esaki diodes 2 and 2' may take either a positive or negative stable point and that point at which the potential will settle may be determined by a slight positive or negative voltage existing at the middle point A at the moment the voltage of the voltage sources 1 and 1' is raised from O to E.

Figure 2:
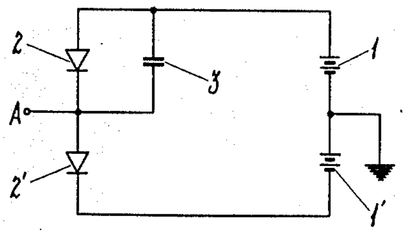
FIGURE 2 is a circuit diagram for explaining the principle of the present invention.

The logic circuit of the present invention shall be explained with reference to FIGURE 2. A pair of Esaki diodes 2 and 2' to be used are preferably of exactly equal characteristics. A condenser 3 is provided in parallel with one of them. Now, if the capacitance of the condenser 3 is C and the voltage of the electric sources 1 and 1' (shown as batteries in this and the following figures) is raised from O to E, a charging current represented by $$C\frac{dE}{dt}$$

will flow through the condenser 3. (C is capacitance of condenser 3.) As this current would raise the potential of point A if there were no condenser 3, the potential of point A could take positive and negative values naturally. But, due to the condenser 3, point A will be stabilized always in the positive potential.

Figure 3:
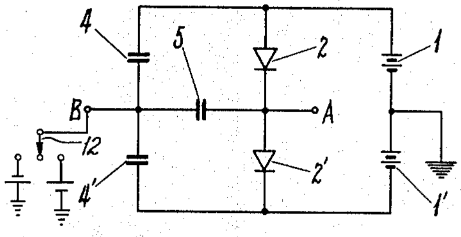
FIGURE 3 is a circuit diagram showing a fundamental embodiment of the logic circuit of the present invention.

The circuit diagram shown in FIGURE 3 shows a fundamental circuit wherein the above mentioned principle is used. Condensers 4 and 4' of equal characteristics, whose capacitance will vary with the voltage, are set in parallel with the Esaki diodes 2 and 2'. Point B is connected with point A of the Esaki diodes through a condenser 5. If there were no input voltage at point B, the potential of middle point A could take positive and negative values naturally. The value of the capacitance of the condensers 4 and 4' is varied with the input voltage given to point B. Now, if, with the positive voltage added to point B, such as by switch 12, the capacitance $C_1$ of the condenser 4 is to become larger and the capacitance $C_2$ of the condenser 4' is to become smaller (that is, $C_1 > C_2$). Thus, the potential of point A will become positive when excitation is added but will become negative in the case reverse to that, that is, when a negative voltage is added to point B.

Figure 4:
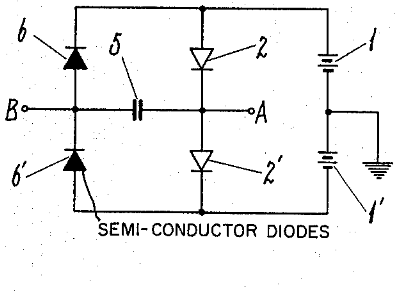
FIGURE 4 is a circuit diagram showing another embodiment of the logic circuit of the present invention.

FIGURE 4 is an embodiment employing semiconductor diodes 6 and 6' as non-linear capacitances in place of said non-linear condensers 4 and 4' shown in FIGURE 3. In such case, the barrier capacitance of the semiconductor diode is used. A backward bias will be given to the semiconductor diode and the semiconductor diode will operate in a non-conductive state. When a positive input voltage is given to the middle point B from another stage, the backward bias of the semiconductor diode 6 will become smaller than the voltage E of the electric sources 1 and 1', and the backward bias of the semiconductor diode 6' will become larger than E. Therefore the semiconductor diode 6 will have a capacitance value larger than that of the semiconductor diode 6'. Thus, the input voltage added to the middle point B will differentially act on the capacity variations of $C_1$ and $C_2$ and the middle point A may be stabilized with a positive potential at the time of excitation. In the same manner, when the input voltage given to the middle point B is negative, the potential of the middle point A will be stabilized at a negative potential.

In the above mentioned circuit, the middle point A which is the output terminal and the middle point B which is the input terminal are separated from each other with respect to a direct current by capacitor 5. The middle point A of the output terminal is of a low impedance, but, as the semiconductor diode is backwardly biased and is in a high resistance state and the capacitance of the condenser 5 can be taken to be small, the middle point B of the input terminal has a high impedance.

Figure 5:
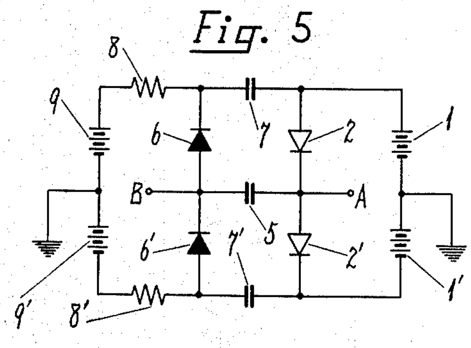
FIGURE 5 is a circuit diagram showing still another embodiment of the logic circuit of the present invention wherein an electric source provides backward bias for a semiconductor diode operating as a non-linear capacitance.

A particular circuit is shown in FIGURE 5 wherein 7 and 7' are coupling condensers, 8 and 8' are resistances and 9 and 9' are bias voltage electric sources so that the bias voltage of the semiconductor diodes 6 and 6' for the barrier capacitance may be freely regulated as insulated from the electric sources 1 and 1' with respect to a direct current.

As described above, even if combined with a feeding stage, the logic circuit according to the present invention will work responsive to only the voltage and thus will not become a load and will occasionally have great utility when many fan-outs are required.

Figure 6:
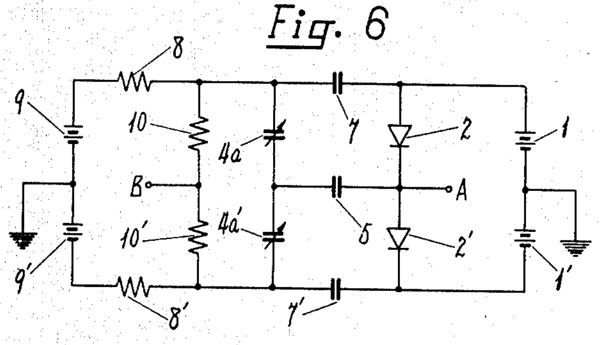
FIGURE 6 is a circuit diagram showing another embodiment of the logic circuit of the present invention wherein input voltage is provided through a voltage dividing resistance provided in parallel with the variable capacitance.

In the circuit shown in FIGURE 6, input point B is connected between voltage dividing resistances 10 and 10' which are in parallel with variable capacitances *4a* and *4a'*. Thus, in response to the positive or negative input voltage, the potential of the variable capacitances *4a* and *4a'* is varied and accordingly the respective capacitance values are varied.

Figure 7:
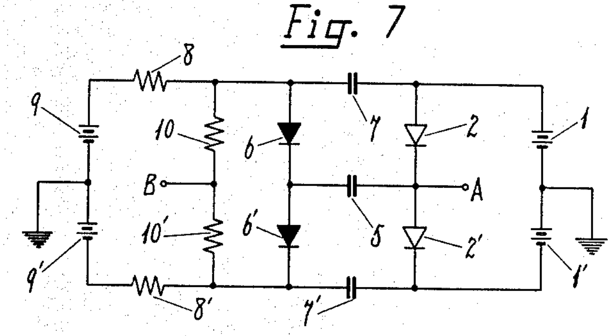
FIGURE 7 is a circuit diagram showing another embodiment of the logic circuit of the present invention wherein a semiconductor diode is used as the variable capacitance.

The circuit shown in FIGURE 7 is an embodiment wherein the barrier capacitance of semiconductor diodes 6 and 6' are used in place of the condensers *4a* and *4a'*. The principle of its operation is exactly the same as is explained with reference to FIGURE 6.

It has already been described that, if Esaki diodes are used, a high speed logic circuit will result. In such case, a majority logic and a "NOT" circuit will be used for the logical operation. However, if a transformer is required in the "NOT" circuit, as in the case of a parametron, it restricts the speed and is not desirable. According to the present invention, there can be provided a circuit wherein variable capacitance elements whose capacitance value will vary with the voltage are added to Esaki diodes so that a "NOT" operation may be carried out without impairing the high speed.

In the Esaki diode logic circuit, the potential will be stabilized to be positive when the input voltage added to the middle point A at the time of excitation is positive and to be negative when it is negative. However, if, on the contrary, the potential can be stabilized to be negative when a positive potential is added in advance to the middle point A at the time of excitation and to be positive when a negative potential is added, the circuit will be a "NOT" circuit. Therefore, according to the present invention, such "NOT" operation as is described above can be carried out by combining a variable capacitance element with an Esaki diode logic circuit having a reverse characteristic for voltage variation contrary to the explanation made with reference to FIGURE 3.

Figure 8:
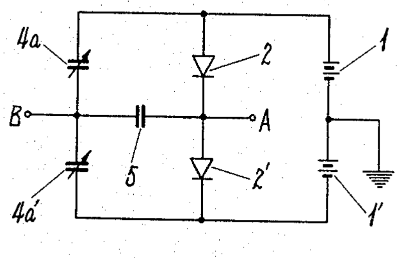
FIGURE 8 is a circuit diagram showing an embodiment of the "NOT" circuit afforded by the present invention.

The circuit shown in FIGURE 8 is an embodiment of a "NOT" circuit wherein variable capacitances are used in place of the condensers 4 and 4' in the circuit shown in FIGURE 3. Variable capacitances **4*a* and 4*a'* are provided in parallel with the Esaki diodes. Capacitance elements whose capacitance will increase with the increase of the added voltage are used for such variable capacitances. A condenser 5 connects the middle point A of the Esaki diodes 2 and 2'** with the middle point B of the variable capacitances *4a* and *4a'*.

Thus, when a positive input voltage is given in advance to the middle point B, the value $C_1$ of the variable capacitance *4a* will become smaller than the value $C_2$ of the variable capacitance *4a'*, that is, $C_1 < C_2$ conversely, when a negative input voltage is given in advance, $C_1 > C_2$. Therefore, when an exciting voltage is added, the stabilizing point of the middle point A will be stabilized with the input voltage in reverse polarity. Further, if variable capacitance, a ferroelectric capacitance or a barrier capacitance of a backward bias of a semiconductor diode is used, the capacitance value will decrease with the increase of the voltage and therefore it can not be used with the circuit as it is. However, for example, silicon carbide and a barrier capacitance of a forward bias of a semiconductor diode are known as elements whose capacitance value will increase with the increase of the input voltage. Any proper one having a small loss among them may be used.

Figure 9:
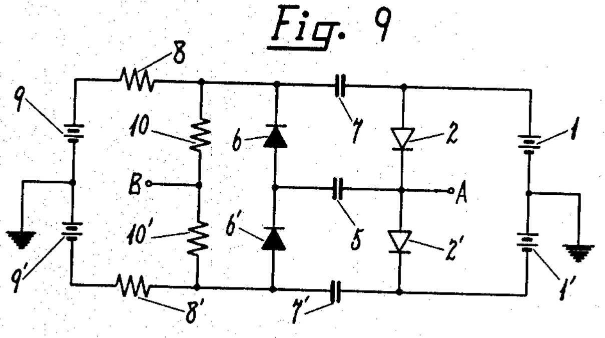
FIGURE 9 is a circuit diagram showing another embodiment of the "NOT" circuit afforded by the present invention.

The circuit shown in FIGURE 9 is a modification of the circuit shown in FIGURE 8 wherein the variable capacitances in FIGURE 8 are differentially operated through a resistance circuit. Semiconductor diodes 6 and 6' are used in place of variable capacitances. Condensers 7 and 7' are inserted between the Esaki diodes 2 and 2' and the semiconductor diodes 6 and 6'. Resistances 10 and 8 and resistances 8' and 10' are inserted between the middle point B and the electric sources 9 and 9', respectively. When a positive voltage is added to point B, the positive voltage will be added to the positive voltage of the electric source 9 through the resistance 10 and will be added to the semiconductor diode 6 so as to increase the positive voltage. On the other hand, it will be added so as to decrease the negative voltage fed from the electric source 9' and added to said semiconductor diode 6' through the resistance 8'. Therefore, the capacitance of the semiconductor diode 6 will decrease, that of the semiconductor diode 6' will increase and the potential of the middle point A will be stabilized in the negative direction at the time of excitation. That is to say, when a positive input voltage is added to point B, a negative voltage will appear at point A. On the contrary, when a negative input voltage is added to point B, a positive voltage will appear at point A and the circuit thus performs a "NOT" operation.

Figure 10:
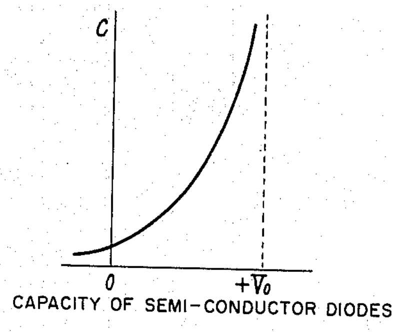
FIGURE 10 is a diagram showing capacitance characteristics of a semiconductor diode.

FIGURE 10 shows the capacitance characteristics of a semiconductor diode. The abscissa represents the voltage and the ordinate represents the capacitance. The capacitance will decrease with the backward bias but will increase with the forward bias. However, when the voltage added to the diode becomes larger than the contact potential difference V*o*, the diode will have a low impedance and will adversely influence the operation of the Esaki diode logical element. In order to prevent it, when the Esaki diodes to be used are of a low operating voltage as when made of germanium, such material of a large contact potential difference as silicon may be used for the variable capacitance.

According to such circuit, when a variable capacitance of a small loss is used, the input impedance as seen from point B will become higher. Therefore, it has an advantage that the fan-out taken may be larger.

Figure 11:
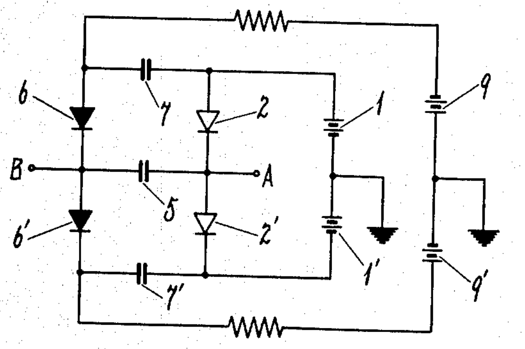
FIGURE 11 is a circuit diagram showing still another embodiment of a "NOT" circuit afforded by the present invention.

FIGURE 11 shows another embodiment of the "NOT" circuit wherein semiconductor diodes 6 and 6' are used in place of the variable capacitances. Other electric sources 9 and 9' than the electric sources 1 and 1' are provided in parallel with the semiconductor diodes 6 and 6' and at the same time the semiconductor diodes 6 and 6' are connected in parallel with the Esaki diodes through coupling condensers 7 and 7'. In the thus formed circuit, an input voltage is given in advance to point B. When it is positive, the terminal voltage of the semiconductor diode 6 will become larger than that of the semiconductor diode 6'. Thus, at the time of excitation, the middle point A will be stabilized at a negative potential. Conversely, when the input voltage is negative, at the time of excitation, the middle point A will be stabilized in a positive potential. Since the variable capacitance elements used as the semiconductor diodes 6 and 6' in this case are biased in the normal direction, elements presenting a large contact potential difference, such as silicon diodes must be used.

Therefore, as compared with the circuit shown in FIGURE 8, one more set of electric sources is required. But the "NOT" operation will become possible without impairing the speed. The input impedance as seen from the middle point B will be so high as not to become a load in the feeding stage. Thus many fan-outs can be taken.

What is claimed is:

1. A logic circuit comprising a pair of Esaki diodes connected in series aiding polarity, respective series connected sources of electrical potential having positive and negative terminals respectively connected to each of said diodes, one of said diodes having its anode connected to a positive terminal of said sources, the other of said diodes having its cathode connected to a negative terminal of the other of said sources and means connected in parallel with each diode for varying the shunt capacitance value of the Esaki diode connected in parallel therewith.

2. A logic circuit according to claim 1, wherein said last mentioned means comprises a pair of variable condensers connected in series, the pair of condensers being connected in parallel with said diodes and a capacitor connected between the point intermediate said condensers and the point intermediate said diodes.

3. A logic circuit according to claim 1, wherein said last mentioned means comprises a semi-conductor diode of the variable capacitance type for each Esaki diode, the semiconductor diodes being connected in series, and means comprising a source of voltage connected to said pair of semi-conductor diodes to bias both the diodes.

4. A logic circuit comprising a pair of Esaki diodes connected in series aiding polarity, a source of electrical potential connected to each of said diodes to apply an equal amplitude and opposite polarity voltage thereto, means connected in parallel with each of said diodes for varying the shunt capacitance thereof, said last mentioned means comprising an input terminal and means for applying a voltage to said terminal.

5. A logic circuit comprising a pair of Esaki diodes of the same characteristics connected in series aiding polarity, electrical source means connected to said diodes to apply equal and opposite voltages thereto, means connected in parallel with each of said diodes for changing the capacitance across said diodes, said last mentioned means including an input voltage terminal connected to apply a potential to the point intermediate said diodes.

6. A logic circuit comprising a pair of Esaki diodes of the same characteristics, connected in series aiding polarity, potential source means having positive and negative terminals respectively and connected to said diodes to apply potentials of equal amplitude and opposite polarity to said diodes, means connected in parallel with each of said diodes for increasing the capacitance across said diodes connected to the positive terminal of said electrical sources, and decreasing the capacitance of said diodes connected to the negative terminal of said electrical sources when an increasing forward bias potential is applied thereto.

7. A logic circuit comprising a pair of Esaki diodes of the same characteristics connected in series aiding polarity, variable electric source means connected to said diodes to apply potentials of equal amplitude and opposite polarity thereto and means connected in parallel with each of said diodes for varying the shunt capacitance thereof in response to the application of a potential to said means whereby said capacitance will increase with the voltage applied thereto.

8. A "NOT" circuit comprising a pair of Esaki diodes of the same characteristics, connected in series aiding polarity, electric source means connected to said diodes for applying potentials of equal amplitude and opposite polarity thereto, a pair of capacitors each connected in parallel with one of said diodes and input voltage means for varying the values of capacitances of said capacitors.

9. A "NOT" circuit according to claim 8, wherein the capacitors are semi-conductor diodes which have a variable capacitance characteristic when the value of input voltage is varied.

10. A "NOT" circuit according to claim 9, wherein said input voltage means includes a resistor in series with each semi-conductor diode.

References Cited by the Examiner

UNITED STATES PATENTS 2,879,409 3/1959 Holt ------------- 307—88.5

OTHER REFERENCES

Electronics, Aug. 7, 1959, page 61, "Tunnel Diode: Big Impact?"

JOHN W. HUCKERT, *Primary Examiner.*

GEORGE N. WESTBY, *Examiner.*